(12) United States Patent
Dwilinski et al.

(10) Patent No.: US 7,364,619 B2
(45) Date of Patent: *Apr. 29, 2008

(54) PROCESS FOR OBTAINING OF BULK MONOCRYSTALLINE GALLIUM-CONTAINING NITRIDE

(75) Inventors: Robert Dwilinski, Warsaw (PL); Roman Doradzinski, Warsaw (PL); Jerzy Garczynski, Lomianki (PL); Leszek P. Sierzputowski, Union, NJ (US); Yasuo Kanbara, Anan (JP)

(73) Assignees: Ammono. Sp. zo.o., Warsaw (PL); Nichia Corporation, Anan-Shi (JP)

(*) Notice: Subject to any disclaimer, the term of this patent is extended or adjusted under 35 U.S.C. 154(b) by 76 days.

This patent is subject to a terminal disclaimer.

(21) Appl. No.: 10/519,141

(22) PCT Filed: Apr. 17, 2003

(86) PCT No.: PCT/PL03/00040

§ 371 (c)(1),
(2), (4) Date: Dec. 27, 2004

(87) PCT Pub. No.: WO2004/003261

PCT Pub. Date: Jan. 8, 2004

(65) Prior Publication Data

US 2006/0032428 A1 Feb. 16, 2006

(30) Foreign Application Priority Data

Jun. 26, 2002 (PL) .................. 354740
Dec. 11, 2002 (PL) .................. 357697

(51) Int. Cl.
*C30B 11/04* (2006.01)

(52) U.S. Cl. .................. 117/81; 117/83

(58) Field of Classification Search .......... 117/81, 117/83
See application file for complete search history.

(56) References Cited

U.S. PATENT DOCUMENTS 5,679,965 A 10/1997 Schetzina et al.

(Continued)

FOREIGN PATENT DOCUMENTS

EP 0949731 A2 10/1999

(Continued)

OTHER PUBLICATIONS

Aoki et al. "Growth of GaN Single Crystals from a Na-Ga Melt at 750° C. and 5MPa of $N_2$," Journal of Crystal Growth 218 (2000); pp. 7-12.

(Continued)

*Primary Examiner*—Felisa Hiteshew
(74) *Attorney, Agent, or Firm*—Morrison & Foerster LLP

(57) ABSTRACT

The invention relates to new improvements in a process for crystal growth in the environment of supercritical ammonia-containing solution, which are based on use of specific azide mineralizers and result in the improved bulk Group XIII element nitride monocrystals, in particular bulk monocrystalline gallium-containing nitride, intended mainly for variety of nitride-based semiconductor products such as various opto-electronic devices. The invention further relates to a mineralizer used for supercritical ammonia-containing solution which comprises at least one compound selected from the group consisting of $LiN_3$, $NaN_3$, $KN_3$, and $CsN_3$.

27 Claims, 8 Drawing Sheets

U.S. PATENT DOCUMENTS

Figure 1:
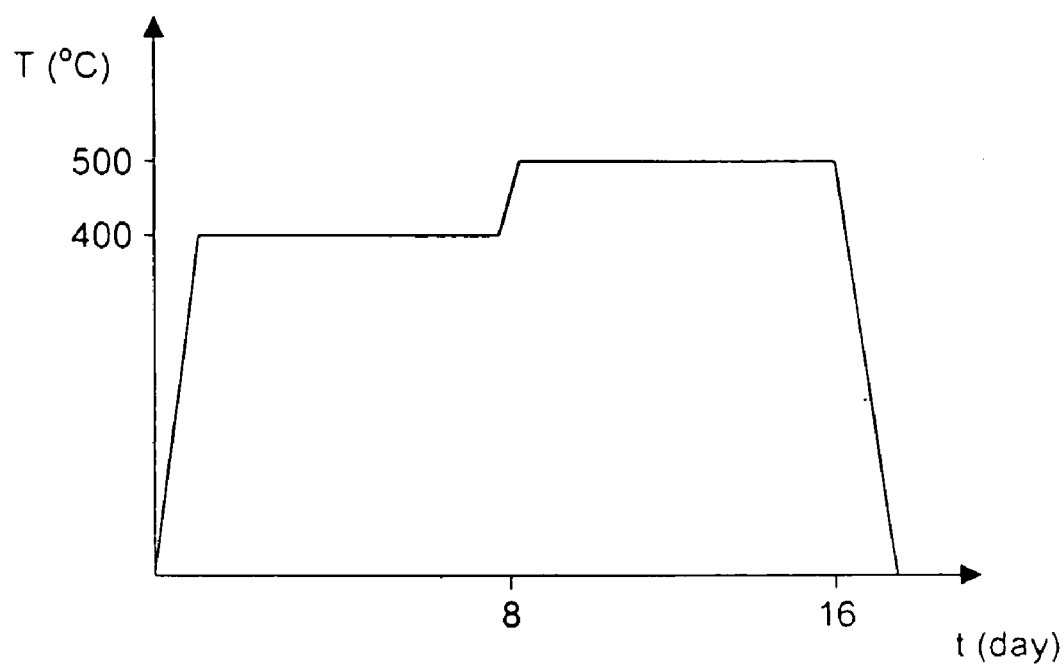

| | | | |
|---|---|---|---|
| 6,046,464 | A | 4/2000 | Schetzina et al. |
| 6,177,057 | B1 | 1/2001 | Purdy |
| 6,249,534 | B1 | 6/2001 | Itoh et al. |
| 6,252,261 | B1 | 6/2001 | Usui |
| 6,329,215 | B1 | 12/2001 | Porowski et al. |
| 6,399,500 | B1 | 6/2002 | Porowski et al. |
| 6,447,604 | B1 | 9/2002 | Flynn et al. |
| 6,459,712 | B2 | 10/2002 | Tanaka et al. |
| 6,468,882 | B2 | 10/2002 | Motoki |
| 6,488,767 | B1 | 12/2002 | Xu et al. |
| 6,509,651 | B1 | 1/2003 | Matsubara |
| 6,593,589 | B1 | 7/2003 | Osinski et al. |
| 6,720,586 | B1 | 4/2004 | Kidoguchi |
| 2002/0014631 | A1 | 2/2002 | Iwata |
| 2002/0031153 | A1 | 3/2002 | Niwa |
| 2002/0047113 | A1 | 4/2002 | Ohno |
| 2002/0063258 | A1 | 5/2002 | Motoki |
| 2002/0078881 | A1 | 6/2002 | Cuomo |

FOREIGN PATENT DOCUMENTS

| | | |
|---|---|---|
| FR | 2796657 A | 1/2001 |
| GB | 2326160 A | 12/1998 |
| JP | 2-137287 | 5/1990 |
| JP | 7-249830 | 9/1995 |
| JP | 9-134878 | 5/1997 |
| JP | 10-7496 | 1/1998 |
| WO | WO-9855671 A | 12/1998 |
| WO | WO-02/101120 A2 | 12/2002 |

OTHER PUBLICATIONS

Yamane et al. "Polarity of GaN Single Crystals Prepared with Na Flux," Jpn. J. Appl. Phys. vol. 37 (1998); pp. 3436-3440.

Ketchum et al. "Crystal Growth of Gallium Nitride in Supercritical Ammonia," Journal of Crystal Growth 222 (2001); pp. 431-434.

Dwilinski et al. "AMMONO Method of BN, AlN and GaN Synthesis and Crystal Growth," MRS Internet J. Nitride Semicond. Res. 3, 25 (1998), pp. 1-4.

Yano et al. "Control of Nucleation Site and Growth Orientation of Bulk GaN Crystals," Jpn. J. Appl. Phys. vol. 38 (1999) pp. L1121-1123.

T. Inoue et al. (2001) "Growth of Bulk GaN Single Crystals by the Pressure-Controlled Solution Growth Method," *Journal of Crystal Growth* 229, pp. 35-40.

M. K. Kelly et al. (1996) "Optical Patterning of GaN Films," *Apply. Phys. Lett.* 69(12), pp. 1749-1751.

W. S. Wong et al. (1999) "Fabrication of Thin-Film InGaN Light-Emitting Diode Membranes by Laser Lift-Off," *Applied Physics Letters* 75(10), pp. 1360-1362.

S. Porowski et al. (1993) "Prospects for High-Pressure Crystal Growth of III-V Nitrides," *Inst. Phys. Conf. Ser.* No. 137, Chapter 4, pp. 369-372.

PROCESS FOR OBTAINING OF BULK MONOCRYSTALLINE GALLIUM-CONTAINING NITRIDE

This application is a 371 of PCT/PL03/00040 filed Apr. 17, 2003.

The invention relates to new improvements in a process for obtaining of bulk monocrystalline gallium-containing nitride, as well as in bulk Group XIII element nitride monocrystals and use thereof (numbering of the Groups is given according to the IUPAC convention of 1989 throughout this application). The improvements relate in general to a process for crystal growth in the environment of supercritical ammonia-containing solution and the crystals obtained in such a process. The improved process and the improved bulk monocrystals are mainly intended for variety of nitride-based semiconductor products such as various opto-electronic devices. The present invention relates also to a mineralizer used for supercritical ammonia-containing solution.

Known opto-electronic devices are based on use of Group XIII element nitrides such as AlN, GaN and InN and mixed Group XIII element nitrides containing two or three Group XIII elements. Such nitrides have thus far been manufactured on sapphire or silicon-carbide substrates, differing from the thereafter deposited nitride layers (i.e. heteroepitaxy).

The two most commonly used methods, i.e. Metallo-Organic Chemical Vapor Deposition (MOCVD) method and Halide Vapor Phase Epitaxy (HVPE) ["Optical patterning of GaN films" M. K. Kelly, O. Ambacher, Appl. Phys. Lett. 69 (12) (1996) and "Fabrication of thin-film InGaN light-emitting diode membranes" W. S. Wrong, T. Sands, Appl. Phys. Lett. 75 (10) (1999)], based on depositing nitrides from the gaseous phase, have many technological drawbacks that make it impossible to obtain bulk monocrystalline layers of desired nitrides of a sufficiently good quality. The nitride monocrystals grown according to those methods have a high surface dislocation density, usually about $10^7/cm^2$ to $10^9/cm^2$. Besides, due to distortion caused by epitaxial growth on hetero-substrates, for example on sapphire, the HVPE substrates have tilted crystal axes, which is detrimental to the quality of the opto-electronic devices produced on such substrates.

Due to significant differences in chemical, physical, crystallographic and electrical properties of substrates such as sapphire or silicon carbide and semiconductor nitride layers deposited thereon by hetero-epitaxy, big technological effort is needed to advance progress in opto-electronics.

Certain decrease of density of dislocations and other defects could be attained by using the Epitaxial Lateral Overgrowth (ELOG) method. In this method, a nitride layer is first grown on the sapphire substrate, and then $SiO_2$ is deposited in the form of strips or grids. Next, such a substrate may be used for lateral nitride growing, reducing the defects density to about $10^7/cm^2$.

On the other hand growth of bulk crystals of gallium nitride and other nitrides of Group XIII elements is also extremely difficult Standard methods of crystallization from melt and sublimation methods are not applicable because of decomposition of the nitrides into metals and $N_2$. In the High Nitrogen Pressure (HNP) method ["Prospects for high-pressure crystal growth of III-V nitrides" S. Porowski et al., Inst. Phys. Conf. Series, 137, 369 (1998)] decomposition is inhibited by applying a nitrogen atmosphere under high pressure. Growth of crystals is carried out in melted gallium, i.e. in the liquid phase, resulting in production of GaN platelets about 10 mm in size. Sufficient solubility of nitrogen in gallium requires temperatures of about 1500° C. and nitrogen pressures of the order of 1500 MPa.

Supercritical ammonia was proposed to lower the temperature and decrease the pressure during the nitride crystals growth process. It was proven in particular that it is possible to obtain crystalline gallium nitride by synthesis from gallium and ammonia, provided that the latter contains Group I element amides ($KNH_2$ or $LiNH_2$). The processes were conducted at temperatures of up to 550° C. and pressure 500 MPa, yielding crystals of about 5 μm in size ["AMMONO method of BN, AlN, and GaN synthesis and crystal growth" R. Dwiliński et al., Proc. EGW-3, Warsaw, Jun. 22-24, 1998, MRS Internet Journal of Nitride Semiconductor Research, http://nsr.mij.mrs.org/3/25].

Use of supercritical ammonia also allowed recrystallization of gallium nitride within the feedstock comprising finely crystalline GaN ["Crystal Growth of gallium nitride in supercritical ammonia" J. W. Kolis et al., J. Cryst. Growth 222, 431-434 (2001)]. Recrystallization was made possible by introduction of amide ($KNH_2$) into supercritical ammonia, along with a small quantity of a halogen (KI). Processes conducted at 400° C. and 340 MPa gave GaN crystals about 0.5 mm in size. However, no chemical transport processes were observed in the supercritical solution, in particular no growth on seeds.

The ammonobasic method for preparing gallium-containing nitride crystals has recently been disclosed in WO 02/101120. The method allows production of gallium-containing nitride monocrystals crystallized on at least one crystallization seed in the presence of a Group I element-containing compound in a supercritical ammonia-containing solution. As feedstock for growth of desired crystals, gallium-containing nitrides are used. The thus obtained gallium-containing nitride bulk monocrystals have surface dislocation density lower than surface dislocation density of seeds used in the process. The bulk monocrystals have sufficient size and regular shape enhancing industrial use of the crystals—among others—as substrates for epitaxy in opto-electronic devices. The major advantage of the discussed method is that it has enabled to lower dislocation density in the thus grown GaN monocrystal layers to less than $10^6/cm^2$. Besides, the bulk nitride monocrystals obtained by that method have high resistivity (in the case of GaN monocrystals within a range of several Ω·cm) and good crystalline quality, as demonstrated by a low value of FWHM of the X-ray rocking curve from (0002) plane—less then 60 arcsec for a Cu K α1 beam.

Ammonothermal method for growing gallium nitride crystals on seeds is described in French patent application FR 2 796 657 A. In view of the experiments disclosed in WO 02/101120 and the experience based thereon, according to the teaching contained in the French application, neither temperature distribution of the process can be successfully selected for the effective crystal growth nor the seeds can be effectively protected against dissolution in supercritical solvent without intensive research being done. Moreover, the arrangement of feedstock and seeds, disclosed in the French application FR 2 796 657 A, is disadvantageous.

Further research studies have proven that the crystalline quality of the optically active nitride layers depends also on other factors, such as presence of heteroatoms in the Group XIII element nitrides lattice. Various sources of such heteroatoms built-in the crystalline structure of the nitrides have been considered and examined.

In a number of tests it has been proven that although the high grade reagents have been used in the process according to WO 02/101120 a content of the undesired impurities fluctuates from one charge of the reaction vessel to another and cannot be easily controlled.

It has further been proven that in spite of use of the various technical measures such as use of a glove box for introducing solid reagents to the reaction vessels, oxygen has turned out to be one of the most troublesome impurities. There are difficulties in controlling its content in the environment of the ammonobasic nitride-crystals growth process, mainly due to the fact that oxygen may be introduced as an impurity contained in the mineralizer necessary to obtain a supercritical ammonia-containing solution.

It is thus the main aim of the present invention to improve the above discussed ammonobasic method for preparing gallium-containing nitride crystals in the presence of mineralizer in a supercritical ammonia-containing solution by elimination of certain impurities from the crystallization solution and obtained nitride crystals, and thus to provide an improved product for use in opto-electronics and electronics. It is a further aim of the present invention to provide a mineralizer suitable for use in the ammonobasic method for preparing gallium containing nitride crystals. These aims have been achieved by developing technical solutions according to the invention as defined in the appended claims.

A process for obtaining a bulk gallium-containing nitride monocrystal according to the present invention is carried out as defined in the independent claims 1 and 2 while the preferred aspects of the process are defined in corresponding dependent claims.

A bulk gallium-containing nitride monocrystal obtained by the process according to the present invention is covered as stated in claim 21 and respective claims dependent on claim 21.

Use of a bulk gallium-containing nitride monocrystals obtained by the process according to the present invention is indicated in the claims 22 to 24.

Finally, mineralizer used for supercritical ammonia-containing solution is defined in the appended claims 25 to 30.

Process for obtaining a bulk gallium-containing nitride monocrystals from supercritical ammonia-containing solution in the presence of a mineralizer, according to the present invention is characterized in that in a pressurized reaction vessel—using ammonia as solvent and Group I element azides and optionally Group II element azides as mineralizer, a supercritical ammonia-containing solution including Group I and optionally Group II element ions is first obtained to dissolve next a gallium-containing feedstock at dissolution temperature and/or dissolution pressure and then the desired gallium-containing nitride is crystallized from the supercritical solution on the surface of at least one seed at the crystallization temperature and/or crystallization pressure, wherein the crystallization temperature and/or crystallization pressure is selected according to the temperature coefficient of solubility and pressure coefficient of solubility of the desired gallium-containing nitride to be crystallized.

Process for obtaining bulk gallium-containing nitride monocrystals from supercritical ammonia-containing solution in the presence of Group I and optionally Group II element-containing mineralizer, according to the present invention is characterized in that when gallium-containing nitride has a negative temperature coefficient of solubility and a positive pressure coefficient of solubility in supercritical ammonia-containing solution, in the presence of Group I and optionally Group II element-containing mineralizer, in a pressurized reaction vessel—using Group I element azides and optionally Group II element azides as mineralizers—supercritical ammonia-containing solution including Group I and optionally Group II element ions is first obtained to dissolve next a gallium-containing feedstock at dissolution temperature and/or dissolution pressure and then gallium-containing nitride is crystallized from the supercritical solution on the surface of at least one seed by means of bringing the temperature to crystallization temperature and/or the pressure to crystallization pressure, the crystallization temperature being higher than the dissolution temperature and/or the crystallization pressure being lower than the dissolution pressure at least at the crystallization zone of the pressurized reaction vessel, where the seed is placed—so that super-saturation of the supercritical solution with respect to the seed is achieved—and then the super-saturation of the supercritical solution is maintained at the level at which spontaneous crystallization of the nitride may be neglected, while crystallization of the desired gallium-containing nitride is carried out on the seed.

In the process according to the invention the gaseous nitrogen, produced during the decomposition of the azide, is preferably at least partially evacuated from the system before the re-crystallization step is started.

In one preferred embodiment of the above process as a gallium-containing nitride—the nitride having a general formula $Al_xGa_{1-x}N$, where $0 \leq x < 1$ is being crystallized.

In the above process the azide mineralizers selected from the group consisting of $LiN_3$, $NaN_3$, $KN_3$, $CsN_3$ and mixtures thereof are used.

The mineralizer used contains at least one compound selected from the group consisting of $LiN_3$, $NaN_3$, $KN_3$ and $CsN_3$. In particular, the mineralizer may contain $NaN_3$ and $KN_3$ or $NaN_3$ and $LiN_3$ or else $KN_3$ and $LiN_3$ mixed in arbitrary molar ratio. The mineralizer may also contain Group I and optionally Group II element-containing compound(s) other than azides.

Group I element azides are introduced into the system in a molar ratio of azides to ammonia ranging from 1:200 to 1:2.

In the process according to the invention a seed crystal with at least one crystalline layer of Group XIII element nitride, preferably gallium-containing nitride, having a dislocation density less than $10^7/cm^2$ is used.

In the process according to the invention a structure having a number of surfaces spaced adequately far from each other, arranged on a primary substrate and susceptible to the lateral overgrowth of crystalline nitrides may be used as a seed.

As the primary substrate of the seed used in the process according to the present invention a crystalline nitride of Group XIII elements, preferably gallium nitride—GaN, is used.

Alternatively, the seed may contain as the primary substrate a crystalline material such as sapphire, spinel, ZnO, SiC or Si, wherein the primary substrate made of the material reacting with a supercritical ammonia-containing solution is covered with a protective layer, preferably made of a nitride containing Group XIII elements or metallic silver, prior to formation of a monocrystalline nitride layer.

Preferably, in the process according to the invention some surfaces of the seeds are covered with a mask layer prior to formation of a monocrystalline nitride layer.

The present process allows to obtain a monocrystalline nitride layer having the same or better quality as it gets thicker.

Preferably, in the process according to the invention bulk nitride monocrystals obtained consist essentially of gallium nitride—GaN. The bulk nitride monocrystals obtained may contain any of the following elements: Ni, Cr, Co, Ti, Fe, Al, Ag, Mo, W, Si and Mn.

The present invention relates also to a bulk nitride monocrystals obtained by the above process.

The thus obtained bulk nitride monocrystals are suitable for use as substrates for epitaxy and as templates, i.e. bulk nitride monocrystals having surface modified by epitaxial monocrystalline layer(s) of the same or different Group XIII element nitride deposited by MOCVD or HVPE or else MBE, optionally doped with various dopants.

Mineralizer used for supercritical ammonia-containing solution according to the invention comprises at least one compound selected from the group consisting of $LiN_3$, $NaN_3$, $KN_3$, and $CsN_3$.

Preferably, it contains $NaN_3$ and $KN_3$ or $NaN_3$ and $LiN_3$, or $KN_3$ and $LiN_3$ in arbitrary molar ratio of $NaN_3$ to $KN_3$, $NaN_3$ to $LiN_3$ and $KN_3$ to $LiN_3$.

Alternatively, it may contain $NaN_3$, $KN_3$ and $LiN_3$ in arbitrary molar ratio of $NaN_3$ to $KN_3$ and $LiN_3$.

Mineralizer according to the present invention may also further contain Group I and optionally Group II element-containing compound(s) other than azides and/or Group I element, and/or Group II element.

The main advantage of the present process according to the invention is that in the product obtained by the process certain uncontrolled impurities can be eliminated. Among such impurities are those introduced to the reaction solution with starting materials, the most troublesome being hygroscopic reagents bringing in oxygen in the form of absorbed water. Significant degree of elimination of oxygen from the bulk nitride monocrystals obtainable by the process according to the present invention is particularly desired when n-type electrically conductive layers are to be produced by using Si dopants.

In this respect the present invention provides successfully an improved product for use in opto-electronics and electronics.

Furthermore, the bulk gallium-containing nitride monocrystals obtained by the process according to the invention have at least one surface suitable for epitaxial growth of semiconducting nitride layers without any additional pre-treatment, the surface being a C-plane or more preferably non-polar A-plane or M-plane.

The big advantage of the process according to the present invention is such, that the dislocation density of the thus obtained bulk monocrystals may be orders of magnitude lower than the dislocation density of the seed used.

Figure 2:
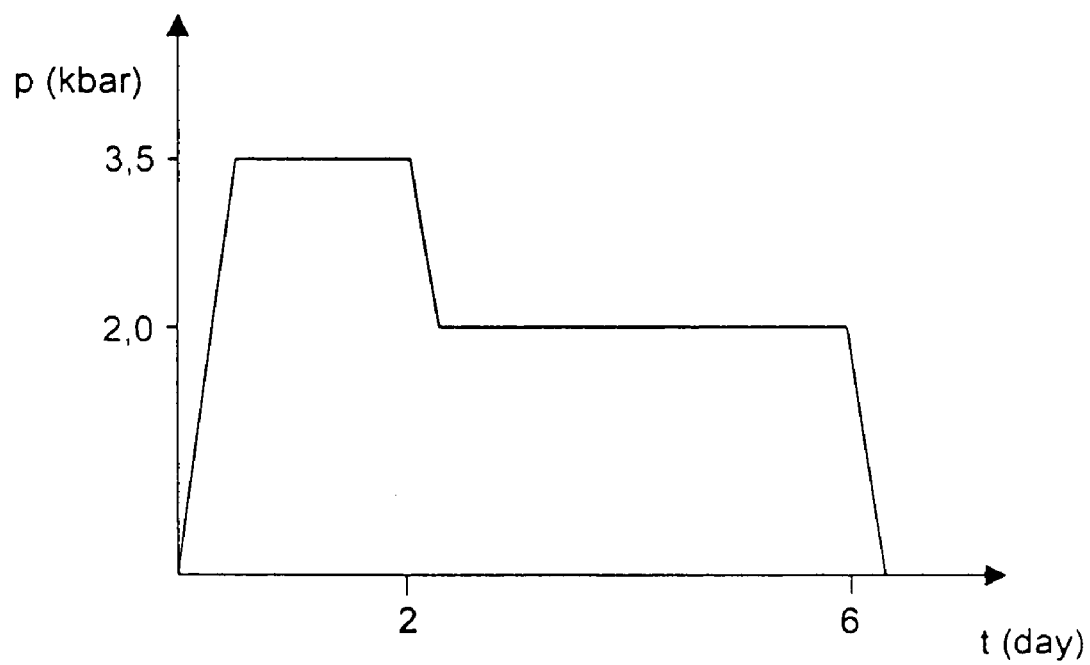
Figure 3:
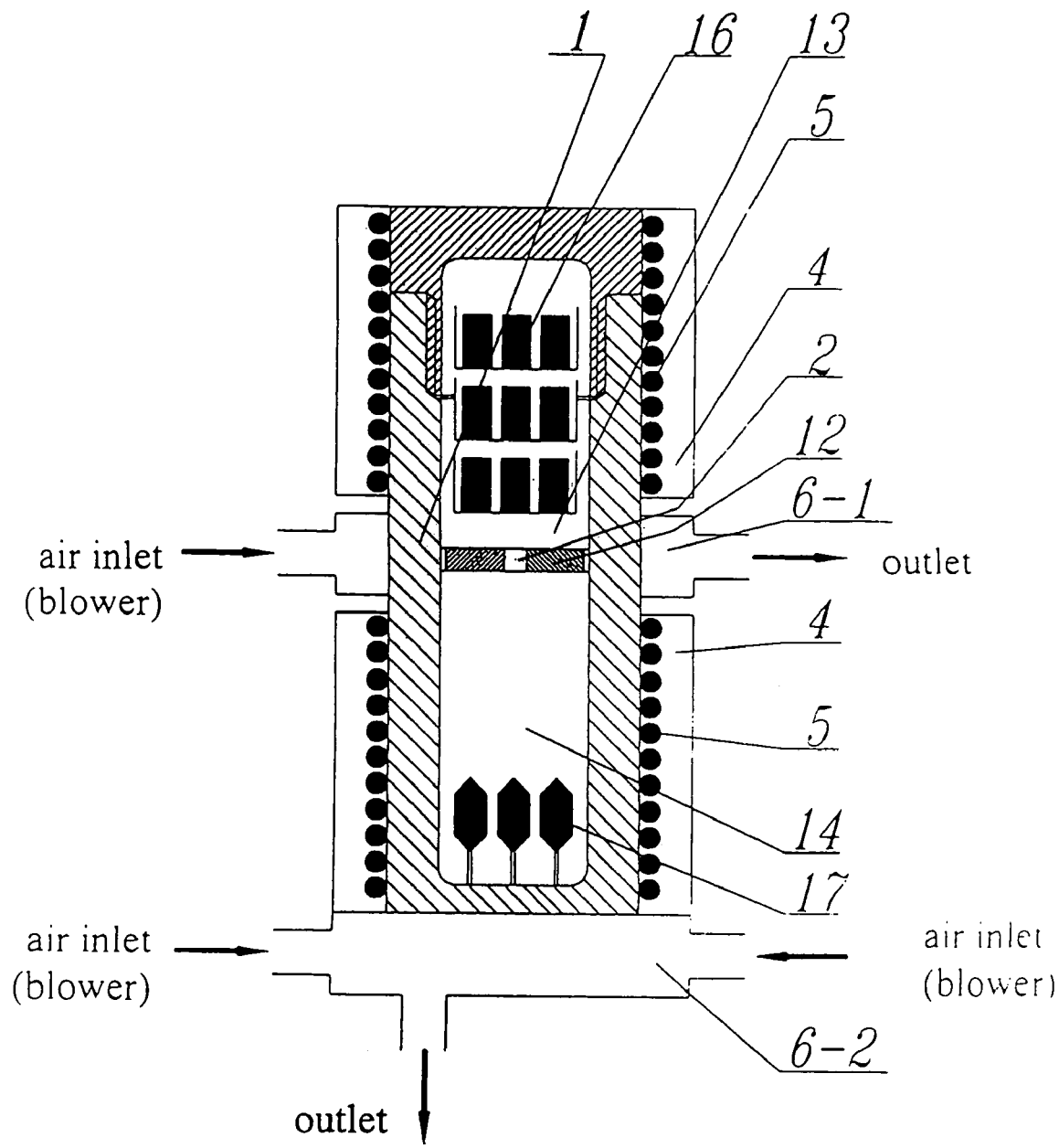
Figure 4:
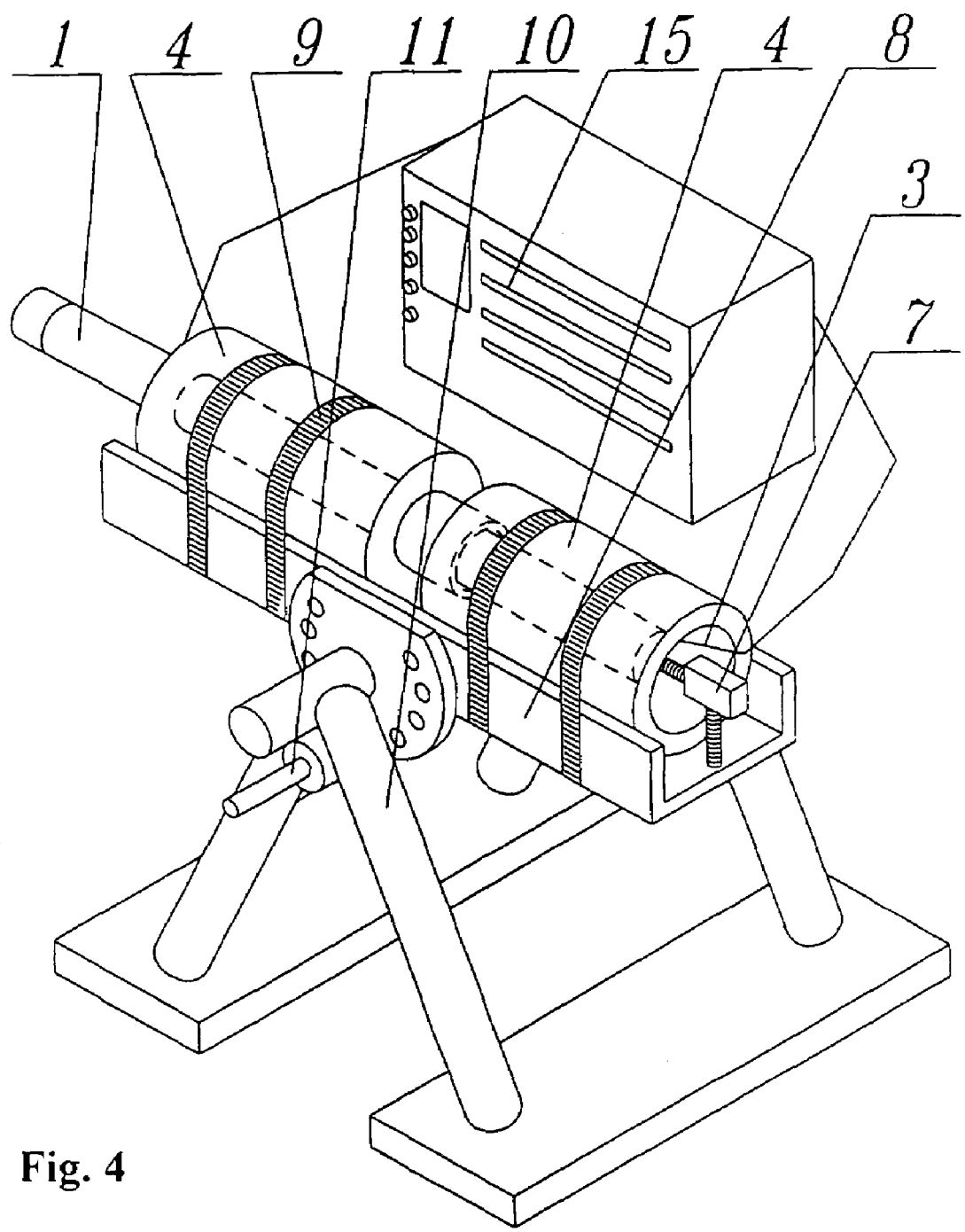
Figure 5:
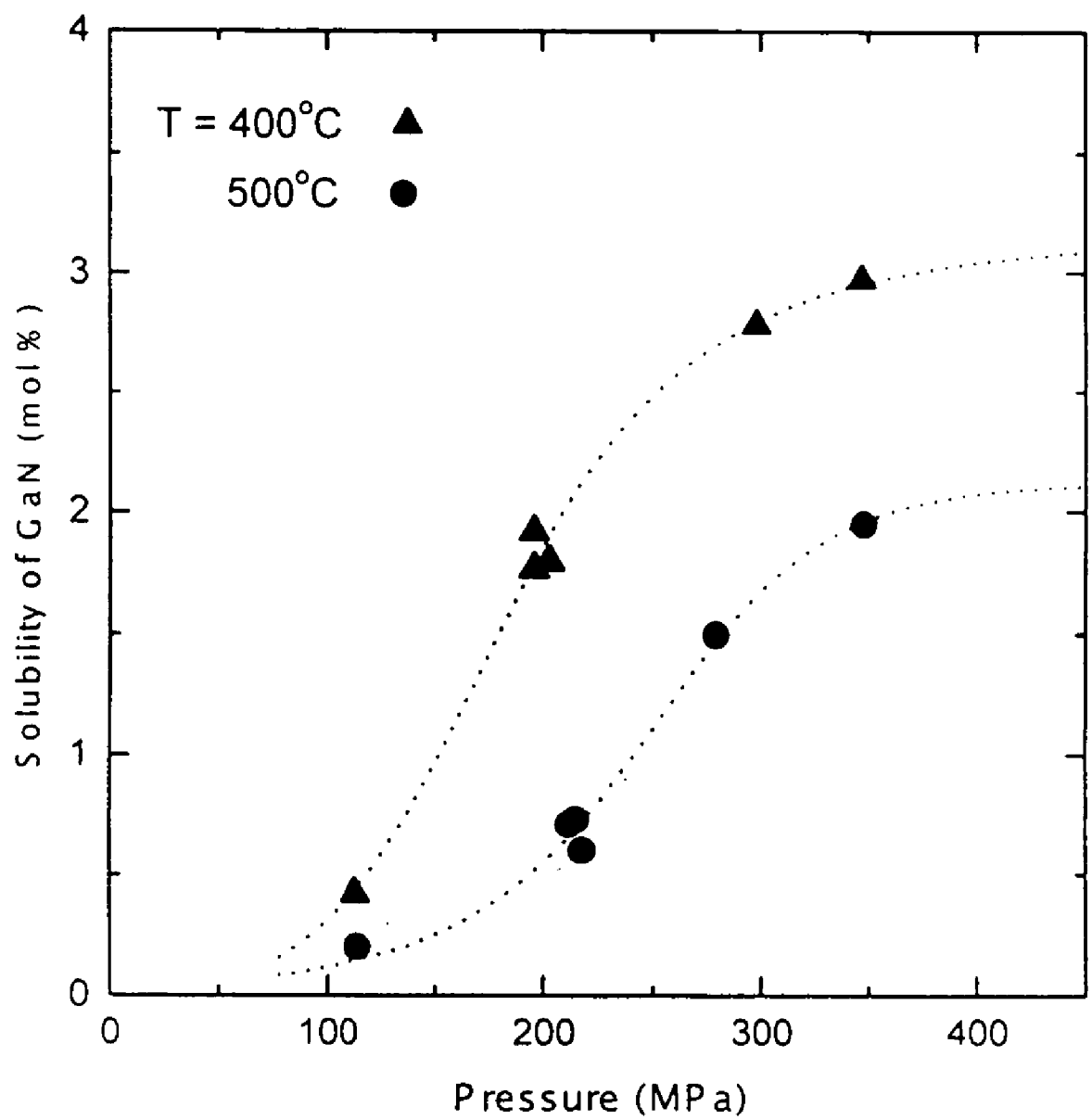
Figure 6:
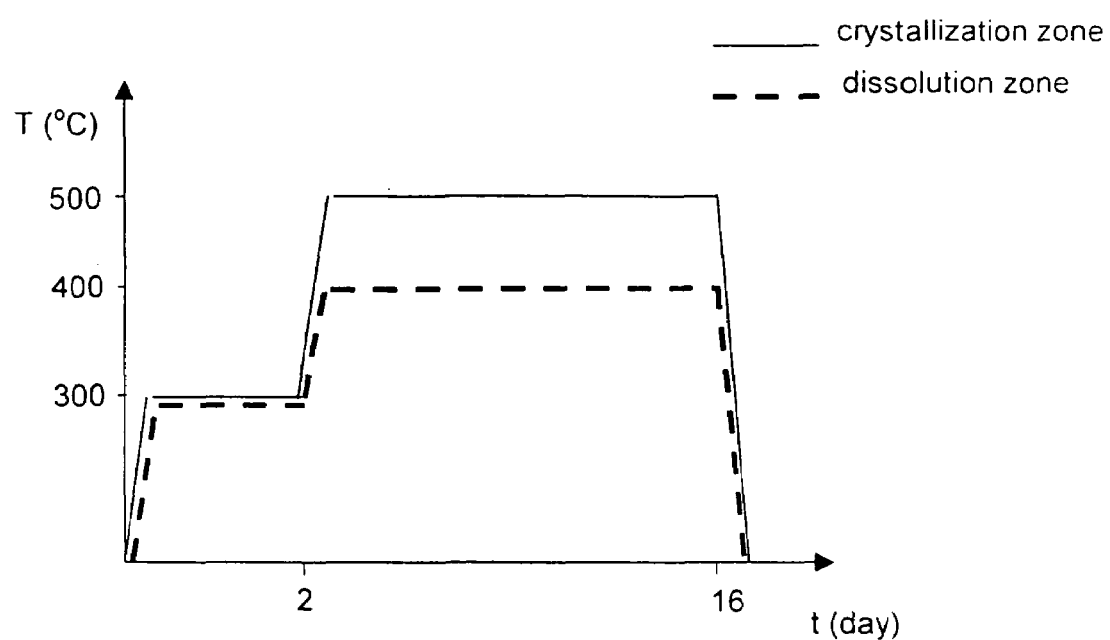
Figure 7:
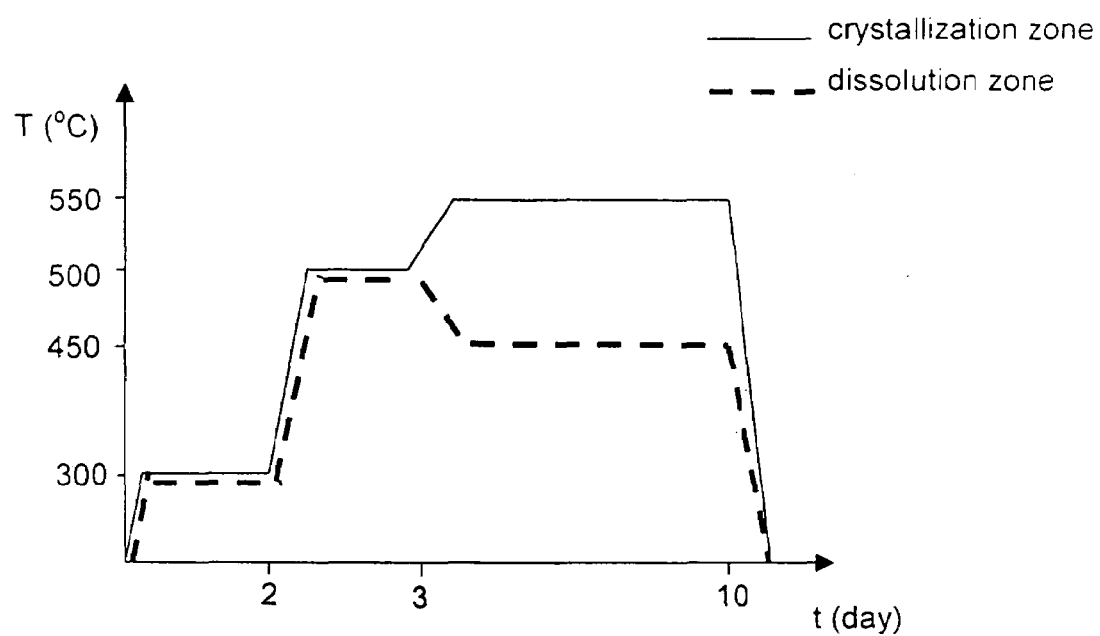
Figure 8:
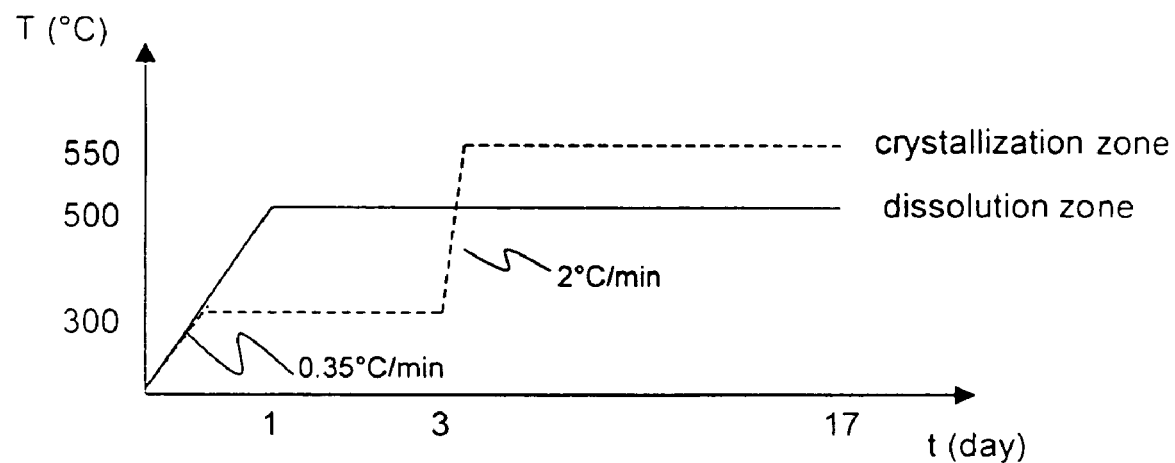
Figure 9:
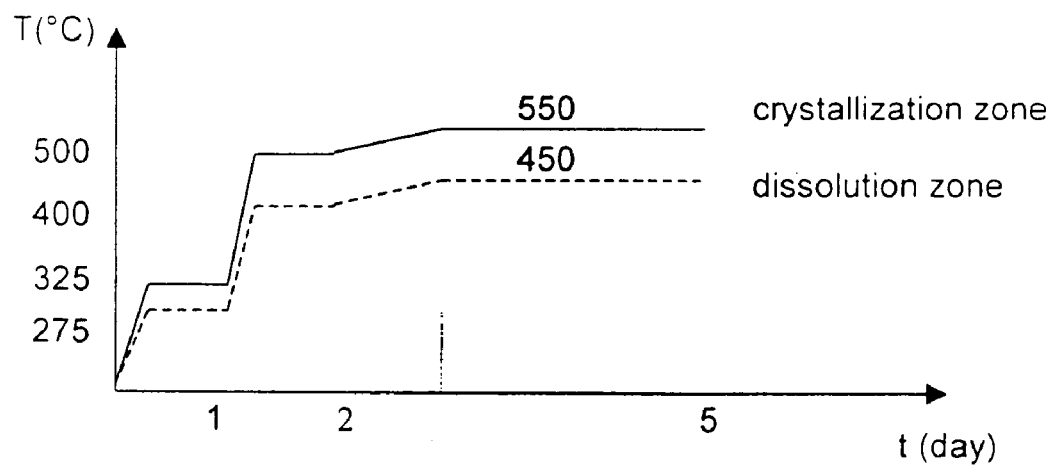
Figure 10:
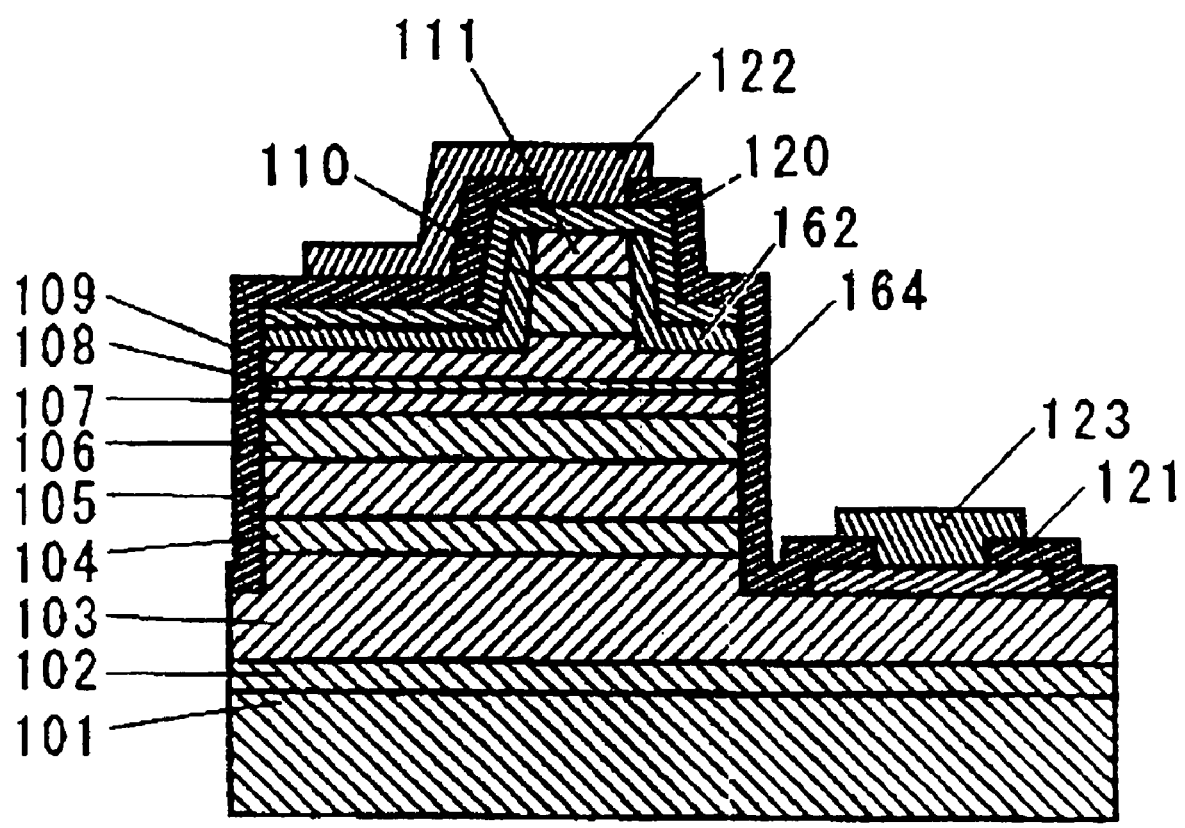
Figure 11:
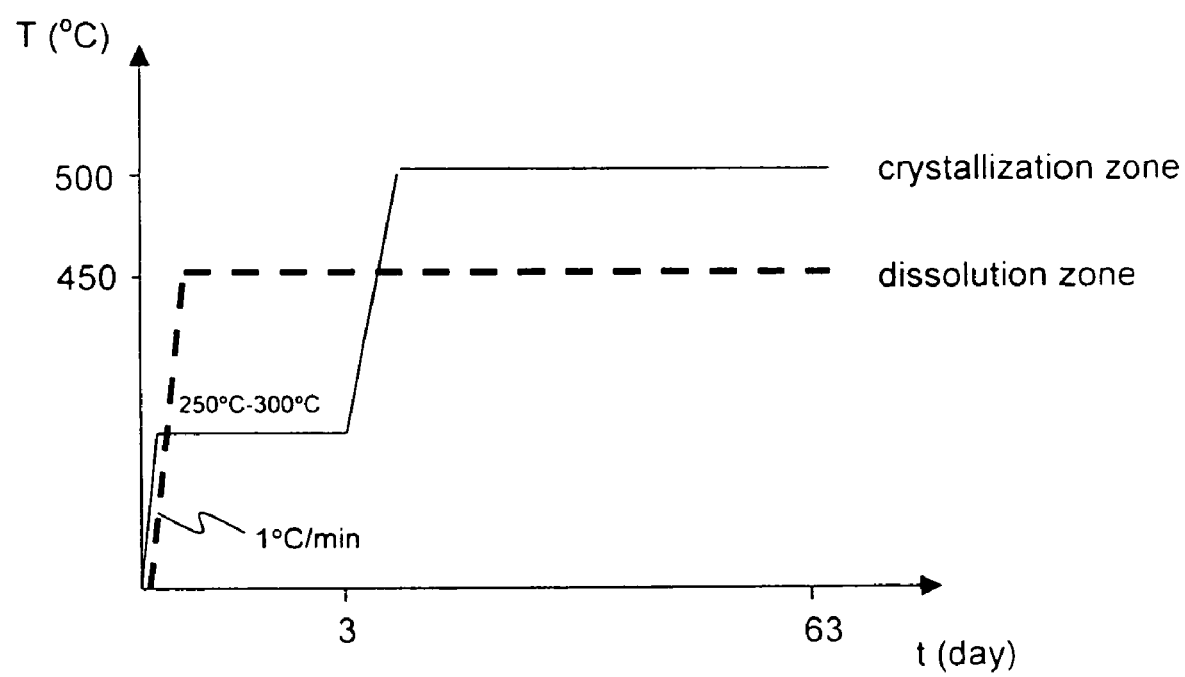

The accompanying drawings illustrate the present invention and FIG. 1 shows the change of temperature in time inside the autoclave at a constant pressure and illustrates the relation between the change of the temperature and dissolution and crystallization steps in the process according to the present invention, FIG. 2 presents the change of pressure in time inside the autoclave at constant temperature and illustrates the relation between the change of the pressure and dissolution and crystallization steps in the process according to the present invention, FIG. 3 shows a schematic axial cross section of an autoclave and a set of furnaces, as used to run the process according to the present invention, FIG. 4 presents a schematic perspective drawing of an apparatus used to run the process according to the present invention, FIG. 5 shows the dependence of GaN solubility in supercritical ammonia containing potassium amide (in the molar ratio of $KNH_2:NH_3=0.07$) on pressure at temperature $T=400°$ C. and $T=500°$ C., FIG. 6 shows the change of temperature in time inside the autoclave in Example 1, FIG. 7 presents the change of pressure in time inside the autoclave in Example 2, FIG. 8 presents the change of temperature in time in the autoclave in Example 3, FIG. 9 presents the change of temperature in time in the autoclave in Example 6, FIG. 10 shows a cross-section of a semiconductor UV laser diode/GaN substrate and FIG. 11 presents the change of temperature in time in the autoclave in Example 8.

In the present invention the following definitions apply:

Group XIII element nitride means a nitride of Group XIII elements, i.e. aluminum, gallium and indium either alone or in any combination. Gallium-containing nitride is the most preferred such nitride.

Gallium-containing nitride means a nitride of gallium and optionally other element(s) of Group XIII. It includes, but is not restricted to, the binary compound GaN, ternary compounds such as AlGaN, InGaN, and also quaternary compound AlInGaN—AlGaN being the most preferred one, where the ratio of other elements of Group XIII to Ga can vary in a wide range.

Bulk monocrystal of gallium-containing nitride means a monocrystal—especially for use as a substrate for epitaxy—made of gallium-containing nitride, from which opto-electronic devices such as LED or LD can be formed by epitaxial methods, such as MOCVD and HVPE.

C-, A- or M-plane refers to C-, A- or M-plane surfaces of hexagonal Group XIII element nitride crystals.

Precursor of gallium-containing nitride is a substance or a mixture of substances containing at least gallium and optionally containing also Group I elements, Group II elements, Group XIII element(s), nitrogen and/or hydrogen; it may also be metallic gallium or alloys of gallium as well as gallium hydrides, amides, imides, amido-imides and azides that can form gallium compounds soluble in supercritical ammonia-containing solvent.

Gallium-containing feedstock is a gallium-containing nitride or Group XIII element nitride or their precursors. As a feedstock, GaN obtained by various methods may be used, among others by flux methods, HNP method, HVPE methods. Moreover, polycrystalline GaN obtained by reaction of metallic gallium with supercritical ammonia-containing solution may be used.

Supercritical ammonia-containing solution means a fluid in a supercritical state, consisting essentially of ammonia and one or more Group I and optionally Group II element ions, used to dissolve a gallium-containing feedstock.

Mineralizer is generally a substance introducing into the supercritical ammonia-containing solution one or more Group I and optionally Group II element ions, affecting dissolution of a feedstock and gallium containing nitride.

Dissolution of gallium-containing feedstock means either reversible or irreversible process of forming out of said feedstock gallium compounds soluble in the supercritical solvent, for example gallium-complex compounds. Gallium complex compounds are complex chemical compounds, in which a gallium atom is a coordination center surrounded by ligands, such as ammonia molecules or its derivatives, like $NH_2^-$, $NH^{2-}$, etc.

Supercritical solution is used when referring to the supercritical solvent when it contains Group XIII element(s), in particular gallium—in a soluble form, originating from the dissolution of a Group XIII element(s)-containing feedstock, in particular gallium.

Solubility: According to our experience at sufficiently high temperature and pressure equilibrium state may be established between the solid state such as gallium-containing nitride and the supercritical solution. For this reason solubility of gallium-containing nitride may be defined as the equilibrium concentration of soluble gallium compounds, as obtained in the above defined dissolution process. In the process according to the present invention the equilibrium concentration, i.e. solubility, may be controlled by changing composition of the solution, temperature and/or pressure.

Negative temperature coefficient of solubility means that the solubility of the respective compound is a monotonically decreasing function of temperature if all other parameters are kept constant. Similarly, positive pressure coefficient of solubility means that, if all other parameters are kept constant, the solubility is a monotonically increasing function of pressure. In our research we have shown that the solubility of gallium-containing nitride in supercritical ammonia-containing solvent possesses a negative temperature coefficient and a positive pressure coefficient in temperature ranging at least from 300° C. to 550° C. and pressure from 100 to 550 MPa. This means that in accordance to FIG. 1, after dissolution of feedstock in an autoclave kept for 8 days at the temperature 400° C. (i.e. after dissolution step) re-crystallization of gallium nitride may be achieved by increasing the temperature inside the furnace to 500° C., while keeping constant pressure of 200 MPa (crystallization step). On the other hand, as shown in FIG. 2, after dissolution of a feedstock at increased pressure in an autoclave kept for 2 days at the level of 350 MPa (i.e. after dissolution step), re-crystallization of gallium nitride is achieved by means of reducing the pressure to 200 MPa while keeping constant temperature of 500° C. (crystallization step).

Super-saturation: if concentration of soluble gallium compounds in supercritical ammonia-containing solution is higher then the solubility of gallium-containing nitride at given physical and chemical conditions, then super-saturation of the supercritical solution with respect to gallium-containing nitride may be defined as the difference between said concentration and solubility. In the case of dissolution of gallium-containing nitride in a closed system, such a super-saturation can be achieved by increasing temperature and/or decreasing pressure.

Chemical transport of gallium-containing nitride in the supercritical solution means a continuous process involving dissolution of a gallium-containing feedstock in the supercritical solution, circulation of the soluble gallium compounds within the solution and crystallization of gallium-containing nitride from the super-saturated supercritical solution. Generally, chemical transport may be caused by temperature difference, pressure difference, concentration difference, or other chemical or physical differences between the dissolved feedstock and the crystallization product. According to the present invention a bulk monocrystalline gallium-containing nitride may be obtained in effect of chemical transport between the dissolution and crystallization zones of the autoclave, established by means of temperature difference between the two zones, whereas the temperature of crystallization zone should be higher than the temperature of dissolution zone.

Seed, as it has already been mentioned, is crucial for obtaining a desired bulk gallium-containing nitride monocrystals in a process according to the present invention. In view of the fact that the quality of the seed is crucial for the crystalline quality of the bulk gallium-containing nitride monocrystals obtained by the process according to the present invention, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as seeds. Moreover, a seed having a homoepitaxial surface, exhibiting n-type electric conductivity, for example doped with Si, may be used. Such seeds can be produced using processes for gallium-containing nitride crystal growth from gaseous phase, such as HVPE or MOCVD, or else MBE. Doping with Si during the growth process at the level of $10^{16}$ to $10^{21}/cm^2$ ensures n-type electric conductivity. Moreover, a composite seed may be used and in such seed directly on a primary substrate or on a buffer layer made for example of AlN—a layer made of GaN doped with Si may be deposited.

Spontaneous crystallization from the super-saturated supercritical solution means any undesired process of nucleation and growth of the gallium-containing nitride crystals taking place at any site within the autoclave except at the surface of the seed crystal(s). Spontaneous crystallization also comprises nucleation and growth on the surface of the seed crystal(s) if the grown crystal has an orientation different from that of the seed.

Selective crystallization on a seed means a process of crystallization taking place on the surface of the seed, carried out without spontaneous crystallization or with spontaneous crystallization taking place to a negligible extend. This is a process indispensable for achieving the aim of the present invention, i.e. obtaining a bulk gallium-containing nitride monocrystal and at the same time an essential element of the present invention.

Temperature and pressure of the reaction: In the practical examples presented in the present specification temperature measurements inside the autoclave have been performed when the autoclave was empty, i.e. without the supercritical ammonia-containing solution. Thus, the temperature values cited in the examples are not the actual temperature values of the process carried out in the supercritical state. Pressure was measured directly or calculated on the basis of physical and chemical data for supercritical ammonia at selected process temperature and the volume of the autoclave. In the process according to the present invention increase of pressure caused by decomposition of azide mineralized was taken into consideration as well.

Autoclave means a closed and pressurized reaction vessel, which has a reaction chamber where the ammonobasic process according to the present invention is carried out.

As it has been stated earlier, the present process involves dissolution of a gallium-containing feedstock in a supercritical solvent and crystallization of a desired gallium-containing nitride on a surface of a seed crystal, with over-saturation of the supercritical solution with respect to the desired gallium-containing nitride, achieved by means of temperature gradient and/or pressure change.

The supercritical solution contains ammonia and/or its derivatives, and includes ions of Group I and optionally Group II elements. The specific ions are introduced in the form of azides, such as lithium azide, sodium azide, potassium azide, and cesium azide, or mixtures thereof.

The feedstock consists essentially of Group XIII element (s)-containing nitrides and/or its precursors, selected from the group including azides, imides, amido-imides, amides, hydrides, Group XIII element(s)-containing metal compounds and alloys, as well as pure metallic elements of Group XIII. Gallium is the preferred Group XIII element.

Generally, the first variant of the process according to the invention allows to improve crystal growth conditions and to obtain a bulk gallium-containing nitride monocrystals from supercritical ammonia-containing solution in the presence of a mineralizer, in a process of selective crystallization on a seed that can take place in turns of chemical transport in the supercritical solution, containing ammonobasic mineralizers.

The present process for obtaining a bulk monocrystalline gallium-containing nitride is characterized in that in a pressurized reaction vessel—using ammonia as solvent and Group I element azides and optionally Group II element azides as mineralizer, a supercritical ammonia-containing solution including Group I and optionally Group II element ions is first obtained to dissolve in the next step a gallium-containing feedstock at dissolution temperature and/or dissolution pressure and then the desired gallium-containing nitride is crystallized from the supercritical solution on the surface of at least one seed at the crystallization temperature and/or crystallization pressure, wherein the crystallization temperature and/or crystallization pressure is selected according to the temperature coefficient of solubility and pressure coefficient of solubility of the desired gallium-containing nitride to be crystallized. In this variant of the process according to the invention it is preferred to run the crystallization process from the supercritical solution super-saturated to such extend as to avoid spontaneous crystallization of the desired gallium-containing nitride, that is to obtain crystal growth on the seeds only.

The second variant of the process according to the present invention is directed to a process for obtaining bulk gallium-containing nitride monocrystals from supercritical ammonia-containing solution in the presence of Group I and optionally Group II element-containing mineralizer, characterized in that when gallium-containing nitride has a negative temperature coefficient of solubility and a positive pressure coefficient of solubility in supercritical ammonia-containing solution, in the presence of Group I and optionally Group II element-containing mineralizer, in a pressurized reaction vessel—using Group I element azides and optionally Group II element azides as mineralizers—supercritical ammonia-containing solution including Group I and optionally Group II element ions is first obtained to dissolve next a gallium-containing feedstock at dissolution temperature and/or dissolution pressure and then gallium-containing nitride is crystallized from the supercritical solution on the surface of at least one seed by means of bringing the temperature to crystallization temperature and/or the pressure to crystallization pressure, the crystallization temperature being higher than the dissolution temperature and/or the crystallization pressure being lower than the dissolution pressure at least at the crystallization zone of the pressurized reaction vessel, where the seed is placed—super-saturation of the supercritical solution with respect to the seed is achieved—and then the super-saturation of the supercritical solution is maintained at the level at which spontaneous crystallization of the nitride may be neglected, crystallization of the desired gallium-containing nitride is carried out on the seed.

If in the second variant of the process according to the invention two separate zones are created in the autoclave, i.e. the dissolution zone and the crystallization zone, the super-saturation of the solution with respect to the seeds can be controlled by regulating the dissolution and crystallization temperature. The temperature control shall present no technical problem if the process is carried out within the temperature range of 300° C. to 600° C., preferably 400° C. to 550° C. and the temperature difference between the two zones is maintained at the level of ca. 150° C., preferably below ca. 100° C. The super-saturation control can be also achieved by placing in the autoclave one or more baffles separating the dissolution zone from the crystallization zone and controlling convective mass flow within the autoclave. Besides, when two separate temperature zones are created within the autoclave, super-saturation of the supercritical solution with respect to the seed may be controlled if the gallium-containing feedstock—for example in the form of GaN—placed in the dissolution zone of the autoclave is used, that has much greater total surface area then the total surface area of the seed placed in the crystallization zone of the autoclave.

Generally, the supercritical solvent should contain mineralizers in order to affect solubility of a feedstock and the solubility can be significantly changed by the presence of Group I and optionally Group II element ions. Lithium, sodium and potassium are preferred as Group I elements, and sodium and potassium are the most preferred.

It has been proven that in the process according to the present invention use of Group I and optionally Group II element azides is beneficial in various aspects, when the molar ratio of Group I element azides to ammonia ranges from 1:200 to 1:2.

The Group I and Group II element azides of very high purity in a solid form are available commercially. Moreover, they can be easily purified. Once purified, the azides retain high purity for a relatively long time, as they are non-reactive and almost non-hygroscopic, thus they do not absorb impurities from air. The azides may be stored, manipulated and (in particular) put into an autoclave without such special precautionary measures or equipment (e.g. a glove box), which are indispensable when handling e.g. metallic lithium, sodium or potassium.

Group I and Group II element azides dissolve in supercritical ammonia-containing solution. The research studies directed to the use of azide mineralizers in processes according to the present invention revealed that under the present process conditions the azide ammonia solution is chemically stable up to certain temperature, at which the azide starts to decompose (in the case of $NaN_3$ this is ca. 250° C.). Below this temperature the azide ammonia solution is hardly reactive with respect to feedstock and the azide does not act as the ammonobasic mineralizer. However, when the temperature of the supercritical ammonia-containing solution goes high enough (in the case of $NaN_3$—beyond 300° C.), intensive decomposition of azide ion $N_3^-$ takes place and molecular nitrogen $N_2$ is released. Only at this stage the azide commences to act as mineralizer, and enhances dissolution of the feedstock and crystallization of gallium-containing nitride on the seed. Thus, if the second variant of the process according to the present invention is realized with metallic gallium as the feedstock, the use of azides makes it easier to control super-saturation and the amount of gallium that does not dissolve.

The main disadvantage of using azides is the extra pressure, originating from the gaseous nitrogen, released during decomposition of azide. The increment of pressure is remarkable and usually undesired, because more durable autoclaves are then needed. However, one can get rid of this effect. There are several ways to do it The one presented below—as an example—should not be construed as limiting. The azide can be first closed in an empty autoclave (or an autoclave filled with an inert gas), together with the other starting materials (feedstock, seeds etc.) and decomposed by heating to the temperature higher than the decomposition temperature of the azide(s) used. The autoclave contains then a mixture, comprising the (undesired) gaseous nitrogen. Then the temperature should be decreased back, below the critical temperature of the mixture, the autoclave should be at least partially evacuated and charged with the solvent (ammonia). Note, that the Group I and optionally Group II elements remaining in the autoclave after decomposition of their azides may have a very high level of purity, hardly available otherwise.

Although the present process may be used in order to obtain a variety of Group XIII element nitrides, it will be further explained in details with respect to gallium-containing nitride.

According to the present invention, crystallization of a bulk monocrystal of gallium-containing nitride takes place in an autoclave, at temperature from 100° C. to 800° C. preferably from of 300° C. to 600° C., most preferably 400° C. to 550° C. and at pressure from 10 MPa to 1000 MPa, preferably from 100 MPa to 550 MPa, while the molar ratio of the above identified azide mineralizers to ammonia ranges from 1:200 to 1:2, preferably from 1:100 to 1:5 and most preferably from 1:20 to 1:8.

In the preferred embodiment, the present invention relates to a method for obtaining a bulk gallium-containing nitride monocrystal grown in a direction parallel to c-axis of hexagonal lattice of a gallium nitride seed in a supercritical ammonia-containing solution with gallium-complex compounds in the Ga:$NH_3$ molar ratio of more than 1:50.

According to the present invention a bulk monocrystal of gallium-containing nitride is crystallized on a surface of the seed crystal.

The seed crystals for crystallization of a gallium-containing nitride by means of a process according to the invention are preferably of the same composition as the desired nitride to be crystallized and such seeds can be obtained by a number of known methods, described in details in literature. Various seed crystals may be used, both homo-seeds and hetero-seeds. Generally, a seed crystal consists of gallium-containing nitride (homo-seed) or at least contains a layer of such a nitride (hetero-seed). For example, gallium nitride crystals may be obtained in effect of spontaneous crystallization from the supercritical ammonia-containing solution. Suitable seed crystals may be obtained by methods of synthesis of GaN based on heteroepitaxial deposition, involving halogens in gaseous phase (HVPE). This method is suitable for reproducible manufacturing of big size seed crystals, having even ca. 5 cm in diameter. Such crystals are available from a number of sources, among others they are produced by NICHIA, ATMI, TDI, SUMITOMO and other manufacturers. Seed crystals can be also obtained by HNP method, under which growth of GaN crystals occurs spontaneously in molten gallium under a high pressure nitrogen atmosphere. Recently the paper "Growth of bulk GaN single crystals by the pressure-controlled solution growth method" by T. Inoue, Y. Seki, O. Oda, S. Kurai, Y. Yamada and T. Taguchi has been published in J. Cryst. Growth 229, 35-40 (2001). The authors described a method for producing GaN, similar to HNP method. In their method the crystal growth is initiated by a slow increase of nitrogen pressure and simultaneously maintaining uniform temperature and not by generating a temperature difference within a crucible with a molten gallium. It was reported that the method allows growing GaN monocrystals having up to 10 mm in diameter. Another method suitable for obtaining seed crystals involves melting a mixture of sodium azide, metallic gallium and metallic sodium. With increasing temperature sodium azide decomposes and releases atomic nitrogen, which in turns reacts with gallium, forming the desired gallium nitride.

Preferably, seeds of monocrystalline GaN are used. GaN seeds obtained by HVPE, flux methods and HNP are available. It is also possible to use as seed monocrystalline GaN plates having A plane (1 1 $\bar{2}$ 0), M plane (1 $\bar{1}$ 0 0), or R plane (1 $\bar{1}$ 0 2) cut out of bulk monocrystal obtained from supercritical ammonia-containing solution. Also N-side of C plane (0001) plate may be used as advantageous seed in the process according to the present invention As mentioned above, depositing a bulk monocrystal of gallium-containing nitride may include lateral growth of the desired nitride on a variety of surfaces susceptible to such growth, placed on a crystal seed and spaced apart from each other. A primary substrate as described below should be considered to be a particular seed crystal, and various materials can be used to form such a substrate including homo-seed crystals in the form of flat wafers or hetero-seeds on which a buffer gallium-containing nitride layer is needed.

According to specific embodiments of the process according to the present invention, the dissolution step and crystallization step may be separated one from the other either by consecutive creation of temperature and pressure condition corresponding to dissolution step and crystallization step in single zone reactor or by creation of at least two zones in the autoclave, in which different temperature is prevailing and placing gallium-containing feedstock in the dissolution zone of lower temperature while placing the seeds in the crystallization zone of higher temperature. The temperature difference between the two zones should be controlled to such extent as to ensure chemical transport in supercritical solution between the two zones.

As mentioned earlier, gallium-containing nitride has a general formula $Al_xGa_{1-x}N$, where $0 \leq x<1$ and it may contain dopants of donor, acceptor or magnetic nature. Ammonia may be used as the supercritical solvent and Group I and optionally Group II element ions should be present in the solution. A feedstock consists essentially of gallium-containing nitride or its precursors, selected from the group consisting of gallium-containing azides, imides, amido-imides, amides, hydrides, and also metallic compounds and alloys, as well as metallic gallium. The seed preferably comprise a crystalline layer of gallium-containing nitride and the layer may be furthermore doped with Si in amount of $10^{16}$ to $10^{21}/cm^3$.

Crystallization of gallium-containing nitride is carried out at temperature ranging from 100° C. to 800° C. and pressure ranging from 10 to 1000 MPa, and the content of Group I and optionally Group II element ions in the supercritical solution is controlled to ensure suitable solubility of the feedstock and of the gallium-containing nitride product. Molar ratio of Group I element ions to ammonia is controlled to range from 1:200 do 1:2.

As a feedstock preferably gallium-containing nitride is used, since such a feedstock may be reversibly dissolved in the supercritical ammonia-containing solution. However, it is possible to combine the use of the nitride as a feedstock with the use of metallic gallium, that undergoes irreversible dissolution in the supercritical ammonia-containing solution and contributes to the increase of the overall concentration of soluble gallium compounds in the solution. Use of gallium nitride as a particular type of feedstock in combination with metallic gallium allows for precise control of the crystallization process when GaN bulk monocrystals are produced by a process according to the present invention.

As mentioned above in the process according to the present invention preferably dissolution step and crystallization step are carried out simultaneously (second variant of the process) in separate zones created and spaced apart in the autoclave. In other words, in the autoclave solvent is brought into the supercritical state and in one zone of the autoclave the gallium-containing feedstock is dissolved while in another zone, at temperature higher than in the dissolution zone and/or at pressure lower than in the dissolution zone, crystallization on the seed is carried out, due to a chemical transport between the two zones, which mainly occurs by convection. In such a process the feedstock is maintained in the lower temperature (or higher pressure) zone while the seeds are kept in the higher temperature (or lower pressure) zone. The temperature difference between the two zones is greater than 1° C. and preferably it is ranging from 5° C. to 150° C., most preferably it is kept below 100° C.

When dissolution and crystallization steps are carried out consecutively, after dissolution of gallium-containing feedstock in the supercritical ammonia-containing solution, there is a transition stage of bringing the solution into higher temperature or lower pressure conditions. In such a case, super-saturation of the supercritical ammonia-containing solution is controlled strictly by temperature control in order to avoid spontaneous crystallization.

In order to carry out the process according to the present invention, it is preferred to use the apparatus described in details further below, which is also schematically represented in FIG. 3 and FIG. 4.

The research studies have shown that the best bulk monocrystalline gallium-containing nitride product obtained by a process according to the present invention had a surface dislocation density below $10^4/cm^2$ and at the same time its FWHM rocking-curve value for the (0002) plane (for Cu K α1) was below 60 arcsec. Such parameters can guarantee the quality and durability of semiconductor devices made of such crystals as substrates for epitaxial layers. Because of the electric conductivity exhibited by the product, n-type electrode may be placed on the substrate.

Gallium nitride exhibits good solubility in supercritical ammonia, provided that the latter contains Group I and optionally Group II elements or their compounds, such as $KNH_2$. The graph in FIG. 5 presents how solubility of GaN in supercritical ammonia-containing solution depends on pressure, for temperature 400° C. and 500° C. Here the solubility is defined as the molar percentage: $S_m \equiv [GaN^{solution}:(KNH_2+NH_3)] \times 100\%$. In this example $KNH_2$ is used in the molar ratio of $KNH_2:NH_3=0.07$. In this case $S_m$ should be a smooth function of only three parameters: temperature, pressure, and molar ratio of the mineralizer (i.e. $S_m=S_m(T, p, x)$). Small changes of $S_m$ can be expressed as:

$$\Delta S_m \approx (\partial S_m/\partial T)|_{p,x} \Delta T + (\partial S_m/\partial p)|_{T,x} \Delta p + (\partial S_m/\partial x)|_{T,p} \Delta X,$$

where the partial derivatives (e.g. $(\partial S_m/\partial T)|_{p,x}$) determine the behavior of $S_m$ with variation of its parameters (e.g. T). In this specification the partial differentials are called "coefficients" (e.g. $(\partial S_m/\partial T)|_{p,x}$ is a "temperature coefficient of solubility").

As it results form the diagram presented in FIG. 5, the solubility is a deceasing function of temperature and an increasing function of pressure. On the basis of these dependences it is possible to obtain bulk monocrystalline gallium-containing nitride by dissolving it under higher solubility conditions and crystallizing under lower solubility conditions. Negative temperature coefficient of solubility means that in the presence of a temperature gradient the chemical transport of gallium-containing nitride occurs from lower temperature dissolution zone to higher temperature crystallization zone.

It has turned out that various compounds and even metallic gallium may be the source of soluble gallium complexes. Once the soluble gallium complexes are introduced into the supercritical solution of the composition described above in the dissolution step, the solution is brought into the super-saturated state by simple change of physical conditions (by increase of temperature or decrease of pressure). It is now possible to crystallize the desired bulk monocrystalline gallium-containing nitride on seeds from super-saturated solution of soluble gallium complexes. When no other Group XIII elements are present in the solution, it is possible to obtain stoichiometric GaN on a monocrystalline GaN seed. The deposited nitride monocrystal may contain Group I elements in a concentration greater that 0.1 ppm since Group I element ions are present in the supercritical ammonia-containing solution. In view of maintaining the desired ammonobasic character of the supercritical ammonia-containing solution, and also in order to avoid corrosion of the reaction vessel, no halogens are intentionally introduced into the supercritical ammonia-containing solution, although some halides may be brought into the solution with starting materials, in particular with a feedstock in the form of HVPE gallium-containing nitride wafers, as well as with seeds obtained by the same method, as the seeds may be slightly dissolved in the early stage of the process.

According to the present invention, intentional replacing of 0.05 to 0.50 Ga by Al may be achieved, because of great similarity of the crystal lattice constants of the GaN and AlN, by a respective modification of the composition of the supercritical solution.

The bulk nitride crystals obtained by the process according to the present invention may be also intentionally doped with donor dopants (such as Si) and/or acceptor dopants (such a Mg, Zn) or else magnetic dopants (such as Mn and Cr) in concentrations of $10^{17}$ to $10^{21}/cm^3$. The dopants change optical, electrical and magnetic properties of the obtained gallium-containing nitride crystals.

The bulk monocrystals obtained have surface dislocation density typically lower than $10^6/cm^2$, preferably lower than $10^5/cm^2$ and most preferably lower than $10^4/cm^2$. What is typical for the process according to the present invention, is that even if monocrystalline seed of a relatively poor surface quality (with dislocation desity higher than $10^7/cm^2$) is used, the obtained bulk gallium-containing nitride layer may have the surface quality significantly improved, so that surface dislocation density value drops to $10^4/cm^2$. As mentioned above, good crystalline quality of bulk monocrystals obtained by the process according to the present invention is additionally confirmed by the fact that the value of FWHM of the X-ray rocking curve from the plane (0002) is typically below 300 arcsec and the best obtained result was below 60 arcsec (for a Cu K α1 reflex).

Below a short description of the apparatus used to carry out the process according to the present invention is provided. The apparatus is schematically presented in FIG. 3 and FIG. 4, although it has to be noticed that the inventive process can be realized in pressurized reaction vessels of different constructions as long as the principles outlined in the specification and the claims are adhered to.

The main part of the apparatus is an autoclave 1 used for bringing the solvent into a supercritical state. The autoclave is equipped with the installation 2, which enhance chemical transport in the supercritical solution within the autoclave 1. The autoclave 1 is situated in the chamber 3 of the furnace 4, equipped with heating units 5 and cooling means 6. Position of the autoclave 1 within the chamber 3 is secured by a screw blocking device 7. The furnace 4 is embedded in the bed 8 and secured with steel tapes 2 tightly wound around the furnace 4 and the bed 8. The bed 8 with the furnace 4 is pivotally mounted on the supporting base 10 and secured in the desired position by means of a pin securing device 11. By tilting the autoclave during the crystallization process it is possible to influence the convective flow and thus the chemical transport. The convective flow in the autoclave 1 placed in the furnace 4 is established by means of the installation 2 in the form of a horizontal baffle 12 of a size corresponding to 70% of horizontal cross section area of the autoclave 1. The baffle 12 separates the dissolution zone 13 from the crystallization zone 14. The horizontal baffle 12 is located approximately in the middle of the autoclave 1 in terms of longitudinal dimension. Temperature values in individual zones of the autoclave 1 within a range between 100° C. and 800° C. are controlled by setting up respective temperature for the furnace 4 by a control unit 15. In the autoclave 1 the dissolution zone 13 corresponding to low temperature zone of the furnace 4 is situated above the horizontal baffle(s) 12. The feedstock 16 is placed in the dissolution zone 13 and the quantity of the feedstock 16 is such that its volume does not exceed 50% of volume of the dissolution zone 13. Simultaneously, when metallic gallium is introduced as the feedstock 16 in crucibles, the total volume of the crucible should not exceed 80% of volume of the dissolution zone 13 and the amount of metallic gallium feedstock 16 should match the former requirement (50% of the dissolution zone volume). The crystallization zone 14 corresponds to high temperature zone of the furnace 4 and is situated below the separating baffle(s) 12. In the crystallization zone 14 the seed 17 is located and the specific position in which the seed 17 is placed is below crossing of up-stream convective flow and down-stream convective flow, but still above the bottom of the crystallization zone 14. The separating baffle(s) 12 is/are positioned within the zone of cooling means 6. As the result of cooling the baffle 12 region, the temperature difference between the dissolution zone 13 and the crystallization zone 14 may be controlled. At the level of bottom of the crystallization zone 14 there is another cooling device 18 used in order to cool down the zone after the process is over, so that the dissolution of the grown crystal(s) during the cooling stage after the process is remarkably reduced.

Due to the good crystalline quality, the bulk monocrystals of gallium-containing nitride obtained by the process according to the present invention may be used as substrates for opto-electronic semiconductor devices based on nitrides, in particular for laser diodes.

The following examples are intended to illustrate the invention and should not be construed as limiting.

EXAMPLE 1

Dissolution zone of an 84 cm$^3$ high-pressure autoclave (FIG. 4) was charged with 6.0 g of feedstock in the form of gallium nitride wafers obtained by HVPE method, each of 200 μm thickness as well as 0.27 g of 6N metallic gallium, and 0.5 g of GaN seeds obtained also by HVPE method were placed in the crystallization zone of the same autoclave. Then 9.8 g of 5N sodium azide and 39 g of 5N ammonia were placed in the autoclave. The autoclave was closed, put into the chamber of a furnace and heated up to 300° C. This temperature was maintained inside the autoclave for the next two days. During that time the azide was decomposed and the ammonobasic solvent was produced, which enabled complete dissolution of metallic gallium. After two days the temperature in the dissolution zone of the autoclave was increased to 400° C., while the temperature of the crystallization zone was increased to 500° C. This temperature distribution inside the autoclave was maintained for another 14 days (FIG. 6). At such conditions the expected pressure within the autoclave is ca. 230 MPa. The real pressure turned out to be ca. 330 MPa and the observed increment was the effect of gaseous nitrogen, produced during decomposition of the azide. As the result of the process, partial dissolution of the feedstock in the dissolution zone and growth of monocrystalline gallium nitride layers on both sides of each seed in the crystallization zone was observed. The total thickness of the re-crystallized layers was ca. 800 μm.

EXAMPLE 2

Dissolution zone of an 84 cm$^3$ high-pressure autoclave (FIG. 4) was charged with 6.0 g of feedstock in the form of gallium nitride wafers obtained by HVPE method, each of 200 μm thickness as well as 1.05 g of 6N metallic gallium, and 0.7 g of GaN seeds obtained also by HVPE method were placed in the crystallization zone of the same autoclave. Then 4.9 g of 5N sodium azide, 2.9 g of 4N metallic potassium and 39 g of 5N ammonia were placed in the autoclave. The autoclave was closed, put into the chamber of a furnace and heated up to 300° C. This temperature was maintained inside the autoclave for the next two days. During that time the azide was decomposed and the ammonobasic solvent was produced, which enabled complete dissolution of metallic gallium. After two days the temperature in the autoclave was increased to 500° C. for one day. Then the temperature of the dissolution zone was decreased to 450° C., while the temperature of the crystallization zone was increased to 550° C. This temperature distribution inside the autoclave was maintained for another 7 days (FIG. 7). At such conditions the expected pressure within the autoclave is ca. 260 MPa. The real pressure turned out to be ca. 310 MPa and the observed increment was the effect of gaseous nitrogen, produced during decomposition of the azide. As the result of the process, partial dissolution of the feedstock in the dissolution zone and growth of monocrystalline gallium nitride layers on both sides of each seed in the crystallization zone was observed. The total thickness of the re-crystallized layers was ca. 700 μm.

EXAMPLE 3

Dissolution zone of an 84 cm$^3$ high-pressure autoclave (FIG. 4) was charged with 8.0 g of feedstock in the form of 6N metallic gallium, and 0.5 g of GaN seeds obtained also by HVPE method, each of ca. 250 μm thickness, were placed in the crystallization zone of the same autoclave. Then 4.9 g of 5N sodium azide and 38 g of 5N ammonia were placed in the autoclave. The autoclave was closed and put into the chamber of a furnace. The temperature in the dissolution zone of the autoclave was increased to 500° C. by slow heating (0.35° C./min), while the temperature in the crystallization zone was maintained at the level of 300° C. The target temperature of 500° C. in the dissolution zone was achieved in ca. 1 day (FIG. 8). This temperature distribution was maintained inside the autoclave for the next two days. During that time the azide was decomposed and the ammonobasic solvent was produced, which enabled partial dissolution of metallic gallium and the reaction of all non-dissolved gallium to polycrystalline GaN. After three days the temperature in the crystallization zone was rapidly (2° C./min) increased to 550° C. This temperature distribution inside the autoclave was maintained for another 14 days (FIG. 8). At such conditions the expected pressure within the autoclave is ca. 270 MPa. The real pressure turned out to be ca. 330 MPa and the observed increment was the effect of gaseous nitrogen, produced during decomposition of the azide. As the result of the process, partial dissolution of the feedstock (i.e. polycrystalline GaN) in the dissolution zone and growth of monocrystalline gallium nitride layers on both sides of each seed in the crystallization zone was observed. The total thickness of the re-crystallized layers was ca. 1.6 mm.

EXAMPLE 4

Procedures as described in Examples 1 to 3 have been repeated except that seeds possessing surfaces susceptible to the lateral overgrowth (ELOG structures) were used. In our case, the ELOG structures had the form of ridges, ca. 10 μm high and 7 μm wide.

Growth of monocrystalline gallium nitride layers on the seeds in the crystallization zone was observed and the deposited GaN layers were of good crystalline quality.

EXAMPLE 5

Procedures as described in Examples 1 to 3 have been repeated except that a mixture of sodium azide and magnesium azide in the molar ratio of $NaN_3:Mg(N_3)_2=20:1$ was used.

Similar results were obtained and bulk monocrystals of GaN deposited on the seeds were of good quality.

EXAMPLE 6

Dissolution zone of an 84 cm$^3$ high-pressure autoclave (FIG. 4) was charged with 0.5 g of feedstock in the form of aluminum nitride tablet as well as 0.28 g of 6N metallic gallium, and 1.6 g of GaN seeds obtained also by HVPE method were placed in the crystallization zone of the same autoclave. Then 9.2 g of 4N sodium azide and 36.6 g of 5N ammonia were placed in the autoclave. The autoclave was closed, put into the chamber of a furnace and the temperature inside the autoclave was increased to 325° C. (in the crystallization zone) and to 275° C. (in the dissolution zone) for one day. The azide was decomposed and ammonobasic solvent was produced, which enabled total dissolution of metallic gallium. The temperature of the dissolution zone was then increased to 400° C., while the temperature of the crystallization zone was increased to 500° C. (FIG. 9). After another day the temperature was very slowly (at ca. 2° C./h) increased to 450° C. and 550° C. in the dissolution and crystallization zones respectively. At such conditions the expected pressure within the autoclave is ca. 260 MPa. The real pressure turned out to be ca. 360 MPa and the observed increment was the effect of gaseous nitrogen, produced during decomposition of the azide. At such conditions the autoclave was maintained for another 2 days (FIG. 9). As the result of the process, partial dissolution of the feedstock (i.e. the AlN tablet) in the dissolution zone and growth of monocrystalline AlGaN layers on both sides of each seed in the crystallization zone was observed. The total thickness of the re-crystallized layers was ca. 10 μm. The deposited layers of mixed nitride were of good quality and two independent measurement techniques (SEM-EDX and X-ray diffraction) revealed that the composition of the layers was $Al_{0.2}Ga_{0.8}N$.

EXAMPLE 7

Semiconductor UV Laser Diode/GaN Substrate

In the enclosed drawing FIG. 10 shows a sectional view of a ridge type UV laser diode 100 having an active layer of $Al_xGa_{1-x}N$ ($0 \leq x < 0.7$) multi-quantum well (MQW) structure, which is formed on the inventive substrate 101 of GaN having a defect density of 10$^6$/cm$^2$ made by the method of crystallization from supercritical solution disclosed in the Polish Patent Application No. P-347918.

As shown in FIG. 10, the following layers are formed on the substrate 101 by MOCVD method: a buffer layer 102 made of 4 μm $Al_{0.05}Ga_{0.95}N$, an n-type contact layer 103 of 5 μm $Al_{0.05}Ga_{0.95}N$ doped with Si, a crack-preventing layer 104 of 0.15 μm $In_{0.06}Ga_{0.94}N$ doped with Si, formed at 800° C., an n-type clad layer 105 of super lattice comprising 100 layers of 2.5 nm (25 Å) $Al_{0.05}Ga_{0.95}N$ doped with Si of $5 \times 10^{18}$/cm$^3$ and 100 layers of 2.5 nm un-doped $Al_{0.1}Ga_{0.9}N$ and an n-type optical guide layer 106 of 0.15 μm un-doped $Al_{0.15}Ga_{0.85}N$. Any other layers than the n-type clad layer 105 may be omitted depending on the device characteristics.

On the n-type nitride semiconductor layers 103 to 106, an active layer 107 is formed, which comprises multi-quantum well structure made by combination of 4.5 nm un-doped GaN well-layer and 10 nm $Al_{0.15}Ga_{0.85}N$ barrier layer, wherein the well layer may be un-doped while the barrier layer may be doped with n-type dopant such as Si of 10$^{17}$ to 10$^{19}$/cm$^3$. In the preferred case, the most upside barrier layer may be un-doped to prevent Mg-diffusion from the next layer, i.e. p-type carrier confining layer 108 containing p-type dopant such as Mg.

On the last barrier layer, the p-type nitride semiconductor is formed, comprising a p-type electron confirming layer 108 of 10 nm p-$Al_{0.3}Ga_{0.7}N$ doped with Mg of $1 \times 10^{19}$/cm$^3$, a p-type optical guide layer 109 of 0.15 μm $Al_{0.04}Ga_{0.96}N$ doped with Mg, a p-type super-lattice clad layer 110 of 90 layers (0.45 μm) of 2.5 nm p-$Al_{0.1}Ga_{0.9}N$/2.5 nm $Al_{0.05}Ga_{0.95}N$ (at least one of them doped with Mg) and a p-type contact layer 111 of 15 nm p-GaN doped with Mg of 10$^{21}$/cm$^3$. Any other layers than the p-type clad layer 110 may be omitted depending on the device characteristics.

The laser diode is provided with a ridge strip made by etching in a manner that both side etched optical guide layer 109 is up to 0.1 μm in thickness. The described device is also provided with a strip-like p-electrode 120 of Ni/Au, a strip-like n-electrode 121 of Ti/Al, a protective layer 162 of $ZrO_2$, a dielectric multi-layer 164 of $SiO_2$ and $TiO_2$, and pad electrodes 122 and 123 of Ni—Ti—Au.

EXAMPLE 8

High-pressure autoclave 1 (FIG. 3 and FIG. 4), having the inner diameter of 40 mm, length equal to 480 mm and volume of 600 cm$^3$, was charged with 53.0 g of 6N metallic gallium in the dissolution zone 13, and 8 seeds of the diameter of 1 inch and mass of 2.0 g each in the form of GaN obtained by HVPE method were placed in the crystallization zone 14 of the same autoclave. Then 46.2 g of 5N sodium azide, 23.5 g of 5N potassium azide and 255 g of 5N ammonia were placed in the autoclave 1. The temperature in the dissolution zone of the autoclave was increased to 450° C. by (at 1° C./min), while the temperature in the crystallization zone was maintained at the level of 250° C.-300° C. (FIG. 11). This temperature distribution was maintained inside the autoclave for the next three days. During that time the azide was decomposed and the ammonobasic solvent characterized by the molar ratios of $KNH_2:NH_3=0.02$ and $NaNH_2:NH_3=0.05$ was produced. This enabled partial dissolution of metallic gallium and the reaction of all non-dissolved gallium to polycrystalline GaN. After three days the temperature in the crystallization zone was increased to 500° C. This temperature distribution inside the autoclave was maintained for another 60 days (FIG. 11). At such conditions the expected pressure within the autoclave is ca. 230 MPa. The real pressure turned out to be ca. 320 MPa and the observed increment was the effect of gaseous nitrogen, produced during decomposition of the azide. As the result of the process, partial dissolution of the feedstock (i.e. polycrystalline GaN) in the dissolution zone 13 and growth of monocrystalline gallium nitride layers on both sides of each seed in the crystallization zone 14 was observed. The total thickness of the re-crystallized layers was ca. 5 mm.

The thus obtained monocrystal was subject to the following processing, so as to obtain substrates for epitaxy:

1) The 5 mm thick monocrystalline layer, deposited on a HVPE-GaN seed was put into a furnace and annealed for 1 to 5 hours in the nitrogen atmosphere, containing also low amount of oxygen, at temperature form 600° C. to 900° C.
2) The monocrystalline layer was placed into the wire saw manufactured by Takatori Corp. It was positioned and sliced so that 5 wafers with the off-angle between 0.05 and 0.2 degree from the main axis of the crystal were obtained.
3) The wafers were put once more into a furnace and annealed for 1 to 5 hours in the nitrogen atmosphere, containing also low amount of oxygen, at temperature form 600° C. to 900° C. (The thus prepared samples are called GaN substrates.)
4) The GaN substrates were mounted on worktables, placed into a polishing machine manufactured by Logitech Ltd. and polished consecutively on each side. In the polishing process diamond tools as well as silica or alumina slurries (with pH from 3 to 6 or else from 9 to 11) were used. The roughness of the obtained surfaces was lower than 10 Å.
5) In the next step, the surfaces of the GaN substrates were covered with a protective layer of GaN or AlGaN, several microns thick, by means of HVPE method. Thus, template substrates were obtained. The conditions of the HVPE process were as follows: reaction temperature: 1050° C., reaction pressure: atmospheric (0.1 MPa), partial pressure of ammonia: 0.03 MPa, partial pressure of $GaCl_3$: 100 Pa, carrier gas: hydrogen.
6) Optionally, on a GaN template with the protective layer (as described in step 5) or on a GaN template without the protective layer, another layer of GaN—3 mm thick—was produced by the HVPE method. After cutting and polishing according to the aforementioned procedure the substrates of thickness of 0.5 mm, suitable as substrates for opto-electronic devices, were obtained.

REFERENCE NUMERALS 1 autoclave
2 installation
3 chamber
4 furnace
5 heating units
6 cooling means
7 screw blocking device
8 furnace bed
9 securing with steel
10 supporting base
11 pin securing device
12 horizontal baffle
13 dissolution zone
14 crystallization zone
15 control unit
16 feedstock
17 seed
18 cooling device
100 ridge type UV laser diode
101 substrate
102 buffer layer
103 n-type contact layer
104 crack-preventing layer
105 n-type clad layer
106 n-type optical guide layer
107 active layer
108 p-type electron confining layer
109 optical guide layer
110 p-type clad layer
121 strip-like n-electrode
122 pad electrode
123 pad electrode.
162 protective layer
164 dielectric multi-layer

The invention claimed is:

1. A process for obtaining a bulk gallium-containing nitride monocrystal, comprising:
    contacting ammonia with a mineralizer comprising a Group I azide in a pressurized reaction vessel to form a supercritical ammonia-containing solution comprising an ion of a Group I element;
    dissolving a gallium-containing feedstock at a dissolution temperature and pressure condition under which the gallium feedstock dissolves in the supercritical ammonia-containing solution; and
    crystallizing a gallium-containing nitride on a surface of a seed at a crystallization temperature and pressure condition,
    wherein the crystallization temperature and pressure condition is determined using a temperature coefficient of solubility and a pressure coefficient of solubility of the gallium-containing nitride to be crystallized.

2. The process according to claim 1, wherein gaseous nitrogen, produced during decomposition of the azide, is at least partially evacuated before the crystallizing step is started.

3. The process according to claim 1, wherein the crystallized gallium-containing nitride has a general formula $Al_xGa_{1-x}N$, where $0 \leq x < 1$.

4. The process according to claim 1, wherein the mineralizer is selected from the group consisting of $LiN_3$, $NaN_3$, $KN_3$, $CsN_3$ and mixtures thereof.

5. The process according to claim 4, wherein the mineralizer contains at least one compound selected from the group consisting of $LiN_3$, $NaN_3$, $KN_3$ and $CsN_3$.

6. The process according to claim 5, wherein the mineralizer contains $NaN_3$ and $KN_3$.

7. The process according to claim 5, wherein the mineralizer contains $NaN_3$ and $LiN_3$.

8. The process according to claim 5, wherein the mineralizer contains $KN_3$ and $LiN_3$.

9. The process according to claim 5, wherein the mineralizer further contains Group I element-containing compound other than azide.

10. A process according to claim 9, wherein the mineralizer further comprises a Group II element-containing compound other than an azide.

11. The process according to claim 1, wherein the Group I azide is added in a molar ratio of azide to ammonia ranging from 1:200 to 1:2.

12. The process according to claim 1, wherein the seed comprises a crystalline layer of Group XIII element-containing nitride having a dislocation density less than $10^7/cm^2$.

13. The process according to claim 1, wherein the seed comprises a structure having a number of surfaces spaced apart from each other, arranged on a primary substrate and susceptible to a lateral overgrowth of a crystalline nitride.

14. The process according to claim 1, wherein a monocrystalline nitride layer that is obtained has the same or better quality as the gallium-containing nitride monocrystal gets thicker.

15. The process according to claim 13, wherein the seed contains the primary substrate made of a crystalline nitride of Group XIII element.

16. The process according to claim 15, wherein the seed contains the primary substrate made of gallium nitride.

17. The process according to claim 15, wherein the seed contains the primary substrate made of a crystalline material such as sapphire, spinel, ZnO, SiC or Si, and wherein the primary substrate made of a material reactive to a supercritical ammonia-containing solution is covered with a protective layer prior to formation of a monocrystalline nitride layer.

18. A process according to claim 17, wherein the protective layer comprises a Group XIII element-containing nitride or a metallic Ag.

19. The process according to claim 1, wherein the bulk nitride monocrystal obtained consists essentially of gallium nitride.

20. The process according to claim 1, wherein the bulk nitride monocrystal obtained contains any of the following elements: Ni, Cr, Co, Ti, Fe, Al, Ag, Mo, W, Si and Mn.

21. The process according to claim 1, wherein a surface of the seed is covered with a mask layer prior to formation of a monocrystalline nitride layer.

22. A process according to claim 1, wherein the mineralizer further comprises a Group II azide and the supercritical ammonia-containing solution further comprises an ion of a Group II element.

23. A process for obtaining a bulk gallium-containing nitride monocrystal, comprising:
    contacting ammonia with a mineralizer comprising a Group I azide in a pressurized reaction vessel at a condition under which a gallium-containing nitride has a negative temperature coefficient of solubility and a positive pressure coefficient of solubility, forming a supercritical ammonia-containing solution comprising an ion of a Group I element;
    dissolving a gallium-containing feedstock at a dissolution temperature and pressure condition under which the gallium-containing feedstock dissolves in the supercritical ammonia-containing solution;
    obtaining a super-saturation of the supercritical ammonia-containing solution at a crystallization temperature and pressure condition having a temperature higher than that of the dissolution temperature and pressure condition or a pressure lower than that of the dissolution temperature and pressure condition; and
    crystallizing a gallium-containing nitride on a surface of a seed by maintaining the super-saturation of the supercritical ammonia-containing solution at the level at which spontaneous crystallization of nitride is negligible.

24. A process according to claim 2, wherein the mineralizer further comprises a Group II azide and the supercritical ammonia-containing solution further comprises an ion of a Group II element.

25. A method for creating an epitaxial layer on a nitride monocrystal, comprising:
    contacting ammonia with a mineralizer comprising a Group I azide in a pressurized reaction vessel to form a supereritical ammonia-containing solution comprising an ion of a Group I element;
    dissolving a gallium-containing feedstock at a dissolution temperature and pressure condition under which the gallium feedstock dissolves in the supereritical ammonia-containing solution;
    crystallizing a gallium-containing nitride on a surface of a seed at a crystallization temperature and pressure condition to obtain a nitride monocrystal,
    wherein the crystallization temperature and pressure condition is determined using a temperature coefficient of solubility and a pressure coefficient of solubility of the gallium-containing nitride to be crystallized; and
    growing an epitaxial layer on the nitride monocrystal.

26. The method of claim 25, wherein the bulk nitride monocrystal has at least one epitaxial layer of the same or different Group XIII element-containing nitride, deposited by a MOCVD, HVPE or MBE method as a template for opto-electronic devices.

27. The method of claim 26, wherein the epitaxial layer is doped with one or more dopants.

* * * * *

UNITED STATES PATENT AND TRADEMARK OFFICE
CERTIFICATE OF CORRECTION

| | | |
|---|---|---|
| PATENT NO. | : 7,364,619 B2 | Page 1 of 1 |
| APPLICATION NO. | : 10/519141 | |
| DATED | : April 29, 2008 | |
| INVENTOR(S) | : Robert Dwilinski et al. | |

It is certified that error appears in the above-identified patent and that said Letters Patent is hereby corrected as shown below:

<u>On the title page, in item (56) Reference Cited:</u>

Please add under the U.S. Patent Documents:

| | | |
|---|---|---|
| 7,160,388 B2 | 01/2007 | Dwilinski et al. |
| 6,270,569 B1 | 08/2001 | Shibata et al. |

Signed and Sealed this

Twenty-second Day of December, 2009

David J. Kappos
*Director of the United States Patent and Trademark Office*